United States Patent
Lee et al.

(10) Patent No.: US 7,151,039 B2
(45) Date of Patent: Dec. 19, 2006

(54) METHOD OF FORMING OXIDE LAYER USING ATOMIC LAYER DEPOSITION METHOD AND METHOD OF FORMING CAPACITOR OF SEMICONDUCTOR DEVICE USING THE SAME

(75) Inventors: Yun-Jung Lee, Seoul (KR); In-Sung Park, Seoul (KR); Gi-Vin Im, Suwon (KR); Ki-Yeon Park, Yongin (KR); Jae-Hyun Yeo, Incheon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 114 days.

(21) Appl. No.: 10/632,825

(22) Filed: Aug. 4, 2003

(65) Prior Publication Data
US 2004/0033698 A1 Feb. 19, 2004

(30) Foreign Application Priority Data
Aug. 17, 2002 (KR) .................. 10-2002-0048720

(51) Int. Cl.
*H01L 21/20* (2006.01)
*H01L 21/31* (2006.01)
(52) U.S. Cl. ........................ 438/396; 438/785
(58) Field of Classification Search ............... 438/396, 438/591, 778, 780, 781, 785
See application file for complete search history.

(56) References Cited

U.S. PATENT DOCUMENTS

| 6,348,386 B1 | 2/2002 | Gilmer |
| 6,391,803 B1 | 5/2002 | Kim et al. |
| 6,407,435 B1 | 6/2002 | Ma et al. |
| 6,420,279 B1 | 7/2002 | Ono et al. |
| 6,660,660 B1 | 12/2003 | Haukka et al. |
| 6,753,618 B1 * | 6/2004 | Basceri et al. ............ 257/296 |
| 2003/0232511 A1 * | 12/2003 | Metzner et al. ............ 438/785 |

FOREIGN PATENT DOCUMENTS

| KR | 10-2001-0082118 | 8/2001 |
| KR | 10-2004-0016779 | 2/2004 |
| KR | 10-2004-0060443 | 7/2004 |

OTHER PUBLICATIONS

Document entitled "Technology Backgrounder: Atomic Layer Deposition" from "IC Knowledge LLC" downloaded from http://www.icknowledge.com/misc_technology/Atomic%20Layer%20Deposition%20Briefing.pdf, 7 pages, 2004.*
Lee et al., "Atomic Layer Deposition of Aluminum Thin films Using an Alternating Supply of Trimethylaluminum and a Hydrogen Plasma", 2002, Electrochemical and Solid-State Letters, 5 (10), C91-C93.*
Ohring, The Materials Science of Thin Films, 1992, Academic Press, Inc., , pp. 339-340.*
Web article entitled "chemisorption and physisorption" retrieved on Oct. 13, 2005 from "http://www.iupac.org/reports/2001/colloid_2001/manual_of_s_and_t/node16.html", 2 pages.*

* cited by examiner

*Primary Examiner*—Evan Pert
(74) *Attorney, Agent, or Firm*—Harness, Dickey & Pierce, P.L.C.

(57) ABSTRACT

In a method of forming an oxide layer using an atomic layer deposition and a method of forming a capacitor of a semiconductor device using the same, a precursor including an amino functional group is introduced onto a substrate to chemisorb a portion of the precursor on the substrate. Then, the non-chemisorbed precursor is removed. Thereafter, an oxidant is introduced onto the substrate to chemically react the chemisorbed precursor with the oxidant to form an oxide layer on the substrate. A deposition rate is fast and an oxide layer having a good deposition characteristic may be obtained. Also, a thin oxide film having a good step coverage and a decreased pattern loading rate can be formed.

25 Claims, 15 Drawing Sheets

METHOD OF FORMING OXIDE LAYER USING ATOMIC LAYER DEPOSITION METHOD AND METHOD OF FORMING CAPACITOR OF SEMICONDUCTOR DEVICE USING THE SAME

CROSS-REFERENCE TO RELATED APPLICATIONS

This application claims priority under 35 U.S.C. § 119 from Korean Patent Application No. 2002-48720, filed on Aug. 17, 2002, the contents of which are herein incorporated by reference in its entirety.

BACKGROUND OF THE INVENTION

1. Field of the Invention

The present invention relates to a method of forming an oxide layer and a method of forming a capacitor of a semiconductor device using such an oxide layer as the dielectric, and more particularly, to a method of forming an oxide layer using an atomic layer deposition (ALD) method and a method of forming a capacitor of a semiconductor device using the same.

2. Description of the Related Art

As the demand for highly integrated semiconductor devices having high operating speeds has continued to increase, the surface area of the semiconductor substrate dedicated to each memory cell has been gradually reduced. As the area of the memory cells is reduced, the horizontal area available for forming the transistor(s) and/or capacitor(s) included in each memory cell has also been reduced.

When the length of a gate electrode of the transistor is reduced, the thickness of the corresponding gate insulation layer is typically also reduced (for example to a thickness of about 20 Å or less). However, reducing the thickness of the gate insulation layer can result in several problems, such as increased gate leakage current, penetration of the gate by dopants or other impurities, reduced threshold voltages, etc. Accordingly, research to identify gate insulation layers having improved insulating characteristics and higher dielectric constants is ongoing.

In addition, as the region for forming the capacitor is reduced, cell capacitance also decreases. When the cell capacitance decreases, the readability of data stored in the memory cell deteriorates, the likelihood of soft errors increases and the memory device becomes difficult to operate satisfactorily at low voltage. Therefore, various methods for increasing the cell capacitance without changing the horizontal surface area occupied by the cell are under development.

Methods suggested for increasing the capacitance that can be achieved within a limited cell area have included reducing the thickness of the dielectric layer and/or forming the lower electrode in a three-dimensional shape such as a cylinder or pin to increase the effective area of the capacitor. However, when manufacturing a dynamic random access memory (DRAM) having a degree of integration necessary to achieve a capacity of about one gigabit or more, it is difficult to achieve a sufficiently high capacitance by employing the suggested methods. To solve this problem, additional research on forming dielectric layers using a material having an increased dielectric coefficient ($\kappa$) is ongoing.

In particular, methods of forming the gate insulation layer of a transistor and/or the dielectric layer of a capacitor using oxides such as $Ta_2O_5$, $Y_2O_3$, $HfO_2$, $ZrO_2$, $Nb_2O_5$, $BaTiO_3$ and $SrTiO_3$ have been developed. The energy band gaps and dielectric constants of these materials are graphically illustrated in FIG. 1.

Generally, a thin layer such as a dielectric layer may be formed by a deposition method such as a chemical vapor deposition (CVD) method, a low pressure chemical vapor deposition (LPCVD) method, a plasma-enhanced chemical vapor deposition (PECVD) method or a sputtering method. When using the above-described methods for forming the thin film, the deposition is typically preformed at a relatively high temperature. As a result, the semiconductor device may receive or incur an unfavorable thermal budget. In addition, thin films formed by the CVD methods tend to suffer from a degree of thickness non-uniformity and lower step coverage percentages than desired for highly integrated devices.

In contrast to CVD deposition methods, atomic layer deposition (ALD) methods can be implemented at lower temperatures, thereby reducing the thermal budget, while also providing improved uniformity and step coverage.

Recently, tantalum oxide ($Ta_2O_5$) having a dielectric constant of about 25 and good thermal stability has become more widely used for forming the dielectric layer of capacitors. However, because $Ta_2O_5$ has a relatively low energy band gap, a capacitor having a dielectric layer formed using $Ta_2O_5$ tends to exhibit a very high leakage current. As shown in FIG. 1, hafnium oxide ($HfO_2$), which provides a dielectric constant of about 20 or more and also exhibits a relatively high energy band gap, may be used to form dielectric layers.

Exemplary methods for forming $HfO_2$ layer are disclosed in U.S. Pat. No. 6,348,386 B1 issued to Gilmer and U.S. Pat. No. 6,420,279 B1 issued to Ono et al. U.S. Pat. No. 6,348,386 B1, discloses a method of forming an insulation layer on a substrate by reacting a first precursor including hafnium and iodine and a second precursor including oxygen. U.S. Pat. No. 6,420,279 B1, discloses a method of forming a nano-laminate of hafnium oxide and zirconium oxide using an ALD process and nitrate-based precursors such as hafnium nitrate and zirconium nitrate. However, according to these disclosures, achieving an $HfO_2$ layer having good step coverage on structures having a high aspect ratio remain difficult.

SUMMARY OF THE INVENTION

Exemplary embodiments of the present invention provide methods of forming an oxide layer having an improved deposition rate and improved deposition characteristics using an atomic layer deposition method.

Also, exemplary embodiments of the present invention provide methods of forming thin films on semiconductor substrates that exhibit improved step coverage and decreased pattern loading rate effects.

Further, exemplary embodiments of the present invention provide methods of forming a capacitor on a semiconductor device that incorporates a dielectric layer having a high dielectric constant.

In an exemplary method of forming an oxide layer using an ALD process according to the present invention, a precursor including an amino functional group is applied to a substrate under conditions that will cause the precursor to chemically absorb (referred to as chemisorb) a portion of the precursor onto the substrate. The non-chemisorbed precursor is then removed from the substrate and an oxidant is introduced to chemically react with the chemisorbed precursor and thereby to form an atomic layer of an oxide on the substrate.

In an exemplary embodiment, the precursor may be represented by the chemical formula $MX_n$ in which M represents an atom of an element from group 2, 3A including lanthanide, 4A, 5A, 3B, 4B or 5B of the periodic table, X represents —$NR_1R_2$ wherein $R_1$ and $R_2$ may be the same or different substituents selected from hydrogen and alkyl groups having 1–4 carbon atoms, and n represents an integer of 2–5.

In another exemplary embodiment, the precursor also includes at least one atom of Sr, Ba, Y, La, Ti, Zr, Hf, V, Nb, Ta, Al, Ge, Pb, As, Sn, Si or Bi.

Examples of suitable precursors include TEMAH (tetrakis-ethyl methyl amino hafnium, $Hf[NC_2H_5CH_3]_4$), TDEAH (tetrakis-diethyl amino hafnium, $Hf[N(C_2H_5)_2]_4$), TDMAH (tetrakis-dimethyl amino hafnium, $Hf[N(CH_3)_2]_4$), $Hf[N(C_3H_7)_2]_4$, $Hf[N(C_4H_9)_2]_4$, $Ti[N(CH_3)C_2H_5]_4$, $Zr[N(CH_3)C_2H_5]_4$, $Sn[N(CH_3)C_2H_5]_4$, $Si[N(CH_3)C_2H_5]_4$, $Ta[N(CH_3)C_2H_5]_5$, $Al[N(CH_3)C_2H_5]_3$ and $(CH_3)_2AlNH_2$.

In exemplary embodiments of the present invention, during the introduction of the precursor, the temperature is typically maintained in a range of about 300° C. or less at a pressure of about 0.4 Torr or less. The introduction of the precursor may be facilitated by an inert carrier gas such as argon, nitrogen or a mixture thereof.

In an exemplary embodiment, the removal of the non-chemisorbed precursor is typically achieved by introducing an inert purge gas such as argon or nitrogen gas to flush the remaining precursor and/or using a vacuum purge.

Exemplary oxidants include $H_2O_2$, $H_2O$, $O_3$, $N_2O$, $NO_2$, plasma $O_2$, remote plasma $O_2$ and plasma $N_2O$. The removal of the residual oxidant may be achieved by introducing an inert gas such as argon or nitrogen gas and/or using a vacuum purge after forming the atomic layer.

In an exemplary embodiment, the above-described processing steps for forming the atomic layer may be repeated as necessary to obtain an oxide layer having a desired thickness.

In an exemplary embodiment, the steps may be implemented at a temperature range of from about 100° C. to about 500° C. within a chamber.

In an exemplary method of forming a metal oxide thin film by an atomic layer deposition, a semiconductor substrate is installed within a chamber. A metal precursor including a metal and an amino functional group is then introduced into the chamber under conditions that will cause a portion of the precursor to chemisorb onto the substrate. The remaining portion of metal precursor that has been chemisorbed onto the substrate is then removed from the chamber. After the remaining metal precursor is removed from the chamber, an oxidant will be introduced into the chamber to react with the chemisorbed metal precursor to form an atomic thin film of metal oxide on the substrate. The remaining unreacted oxidant is then removed from the chamber.

In an exemplary embodiment, the thin film formed on the substrate is a dielectric layer of a capacitor or a gate insulation layer.

In an exemplary method of forming a capacitor of a semiconductor device, a first electrode is formed on a semiconductor substrate and a metal precursor containing an amino functional group is introduced onto the first electrode under conditions that cause a portion of the precursor to chemisorb onto the first electrode. The remaining portion of the metal precursor (that portion which has not been chemisorbed) is then removed from the chamber. An oxidant is then introduced into the chamber to react with the chemisorbed metal precursor to form a dielectric layer. After the dielectric layer has been formed, the remaining unreacted oxidant is removed from the chamber, typically by introducing an inert gas or gases and/or using a vacuum purge. A second electrode is then formed on the dielectric layer to complete the basic capacitor.

In an exemplary embodiment, the first electrode is formed in a cylindrical shape and may include one or more layers of doped polysilicon, metal nitrides and metals, and may comprise a stacked structure incorporating several different conductive layers. In another exemplary embodiment, the first electrode includes a doped polysilicon layer and a nitride layer formed thereon to prevent or reduce oxidation of the polysilicon during subsequent processing. The second electrode, like the first electrode, may comprise one or more layers of doped polysilicon, metal nitrides or metal or a composite stacked structure incorporating several such layers.

In another exemplary embodiment, a second and different metal oxide layer may be added to the dielectric layer using an ALD method. In another exemplary embodiment, a first metal oxide layer such as $HfO_2$ may be combined with a second metal oxide layer such as $Al_2O_3$.

According to exemplary embodiments of the present invention, a thin film having improved step coverage and improved deposition characteristics can be formed by reacting a metal precursor containing an amino functional group and an oxidant in an ALD method. When the thin film is applied as the dielectric layer of a capacitor or as the insulation layer of a gate in a semiconductor process, the stability and reliability of the resulting semiconductor device can be improved.

BRIEF DESCRIPTION OF THE DRAWINGS

Exemplary embodiments of the present invention will become readily apparent by reference to the following detailed description when considered in conjunction with the accompanying drawings wherein.

DETAILED DESCRIPTION OF THE EXEMPLARY EMBODIMENTS

Hereinafter, exemplary embodiments of the present invention will be described in detail.

Figure 1:
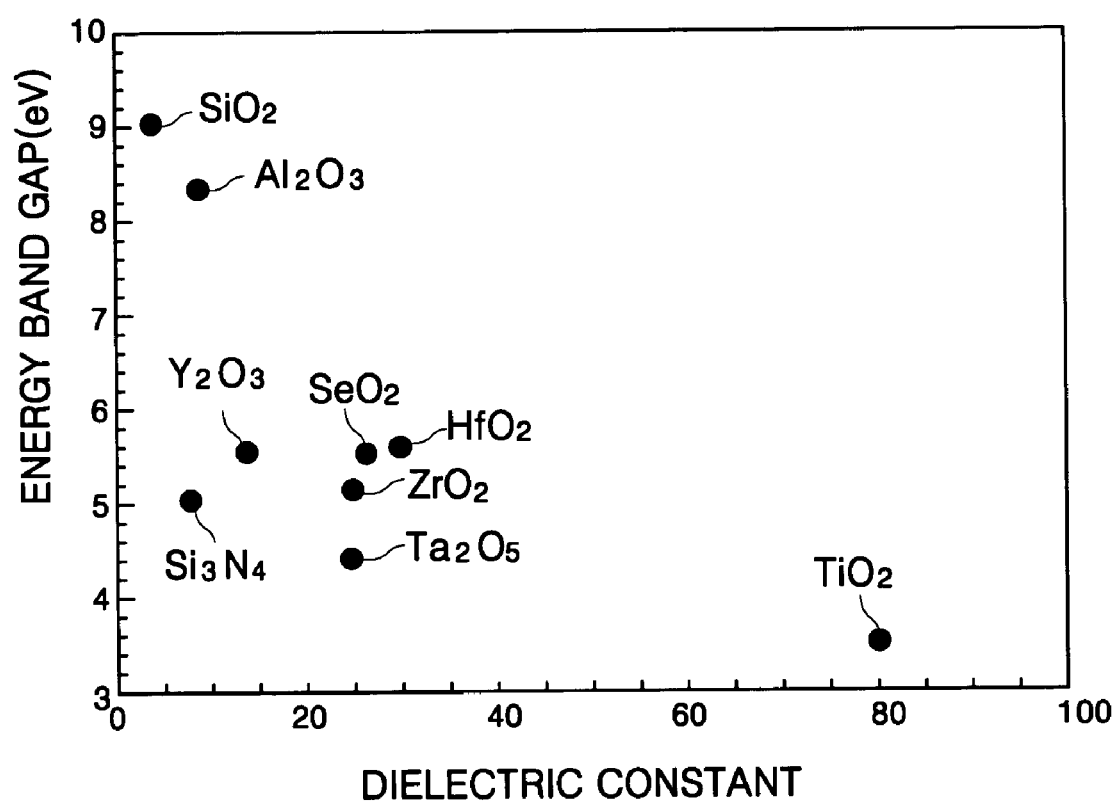
FIG. 1 illustrates the energy band gaps and dielectric constants of various materials.
Figure 2A:
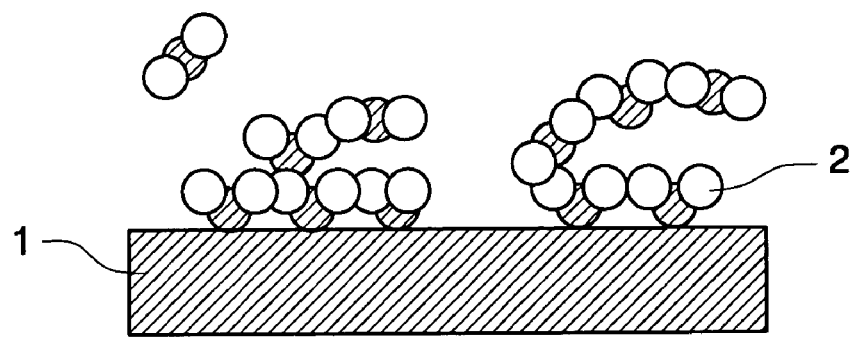
FIGS. 2A–2E are cross-sectional views for explaining a method of forming an oxide layer using an ALD method according to an exemplary embodiment of the present invention.

FIGS. 2A to 2E are cross-sectional views for explaining an exemplary embodiment of forming an oxide layer using an atomic layer deposition method. As illustrated in FIG. 2A, a substrate 1, such as a silicon wafer, is placed in a chamber in which a temperature of from about 100° C. to about 500° C. is maintained. The pressure of the chamber is controlled to about 0.4 Torr or less. In an exemplary embodiment, the temperature range is from about 150° C. to about 350° C. A precursor containing one central metal or semi-metal element and an amino functional group is introduced into the chamber using an inert carrier gas such as argon (Ar) or nitrogen ($N_2$) at a flow rate of about 50–5000 sccm for about 1–3 seconds to form an absorption layer 2 on the substrate. In an exemplary embodiment, the flow rate of the inert gas is in a range of about 500–1500 sccm.

The precursor includes a compound represented by a chemical formula of $MX_n$, where M represents at least one atom of at least one element from Group 2, 3A including lanthanide, 4A, 5A, 3B, 4B and 5B of the periodic table. In an exemplary embodiment, the element includes at least one element selected from Sr, Ba, Y, La, Ti, Zr, Hf, V, Nb, Ta, Al, Ge, Pb, As, Sn, Si and Bi. In addition, X represents —$NR_1R_2$ wherein $R_1$ and $R_2$ may be the same or different substituents selected from hydrogen and alkyl groups having 1–4 carbon atoms, such as methyl, ethyl, n-propyl, iso-propyl, n-butyl, isobutyl and tert-butyl groups, and n represents an integer of 2–5.

In an exemplary embodiment, the metal precursor is a hafnium metal compound containing hafnium and an amino functional group. Examples of such metal precursors include TEMAH (tetrakis-ethyl methyl amino hafnium, $Hf[NC_2H_5CH_3]_4$), TDEAH (tetrakis-diethyl amino hafnium, $Hf[N(C_2H_5)_2]_4$), TDMAH (tetrakis-dimethyl amino hafnium, $Hf[N(CH_3)_2]_4$), $Hf[N(C_3H_7)_2]_4$ and $Hf[N(C_4H_9)_2]_4$. These compounds can be used alone or in a mixture. Other suitable precursors include, $Ti[N(CH_3)C_2H_5]_4$, $Zr[N(CH_3)C_2H_5]_4$, $Sn[N(CH_3)C_2H_5]_4$, $Si[N(CH_3)C_2H_5]_4$, $Ta[N(CH_3)C_2H_5]_5$, $Al[N(CH_3)C_2H_5]_3$ and $(CH_3)_2AlNH_2$.

In an exemplary embodiment, a hafnium oxide ($HfO_2$) layer exhibiting good step coverage and a high dielectric constant is formed utilizing an ALD method for forming a thin film.

When the metal precursor is introduced onto the substrate, a portion of the metal precursor is chemisorbed onto the surface portion of the substrate to form a precursor layer while another portion of the metal precursor tends to be physically absorbed (i.e., physisorbed) onto the chemisorbed molecules or present as free molecules within the deposition chamber.

Figure 2B:
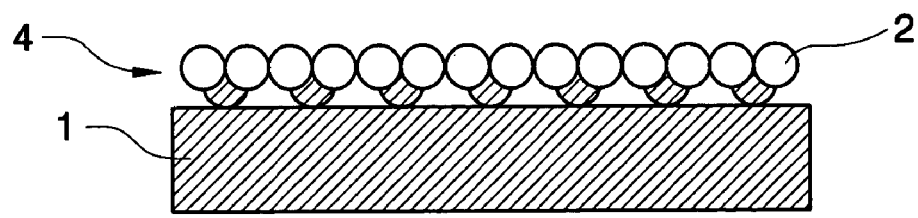

Referring to FIG. 2B, an inert gas such as argon or nitrogen is introduced to remove the portion of the metal precursor that has not been chemisorbed onto the substrate using a purge and/or a vacuum purge process. In an exemplary embodiment, a satisfactory period for maintaining the purge or the vacuum purge process is about 1–20 seconds. In another exemplary embodiment, the time period is 1–4 seconds. During the purge process, the materials that are not chemisorbed are removed from the chamber leaving precursor molecules in the chemical absorption layer 4 on the substrate 1.

Figure 2C:
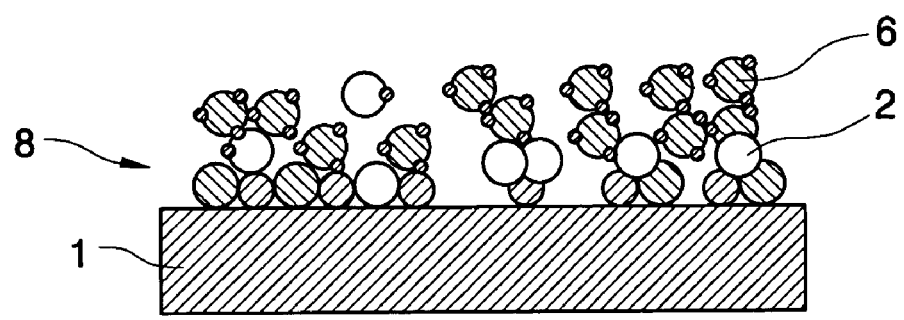

Referring to FIG. 2C, an oxidant 6 is then introduced into the chamber. In an exemplary embodiment, the oxidant is introduced into the chamber at a flow rate of about 500 sccm for about 2–5 seconds. The chemical absorption layer 4 and the oxidant chemically react with each other to form a metal oxide atomic layer 8 on the substrate. For example, the Hf contained in a chemisorbed hafnium precursor layer and oxygen originating from the oxidant can react on the surface of substrate 1 to form an atomic layer of $HfO_2$.

The oxidant may include one or more oxidants including activated oxidants that may produce an oxygen radical as well as oxidants containing a hydroxyl functional group. Examples of activated oxidants include ozone ($O_3$), which may be produced by a plasma generating instrument, plasma $O_2$, remote plasma $O_2$ and plasma $N_2O$. When oxygen gas is treated to form ozone, a portion of the $O_2$ gas is converted into $O_3$ to produce a mixed $O_2/O_3$ stream typically comprising about 5 to 15 mole percent ozone. In addition, exemplary oxidants include those that contain a hydroxyl function group, such as $H_2O$ and $H_2O_2$ and other oxygen containing compounds such as $N_2O$ and $NO_2$.

Figure 2D:
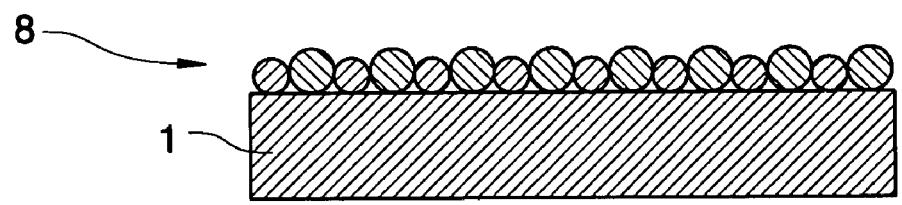

Referring to FIG. 2D, the unreacted oxidant may be removed from the chamber using a purge and/or a vacuum purge process with an inert gas such as argon or nitrogen. In an exemplary embodiment, a satisfactory period for maintaining the purge or the vacuum purge process is about 1–20 seconds. In another exemplary embodiment, the purge time period is 1–4 seconds after forming metal oxide layer 8.

Figure 2E:
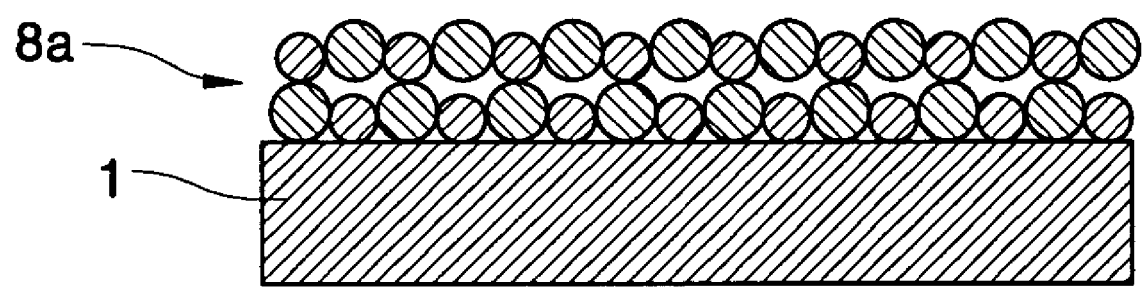

Referring to FIG. 2E, a thicker metal oxide layer 8a having a desired thickness is formed on a substrate 1 by repeating the above-described steps of introducing the metal precursor onto the substrate to form a chemisorbed precursor layer, purging to remove the precursor compounds not included in the chemisorbed precursor layer, introducing an oxidant to oxidize the chemisorbed metal precursor layer and purging the chamber to remove the unreacted oxidant.

During implementing the above-described steps, an exemplary temperature range within the chamber is about 100–500° C. In another exemplary embodiment, the temperature in the chamber is maintained at a temperature of about 150–350° C. Through this temperature control, thermal damage to and/or the thermal budget of underlying layers can be reduced or minimized during the formation of metal oxide layers such as $HfO_2$.

A liquid source of the metal precursor containing an amino functional group utilized in exemplary embodiments of the present invention have a relatively high vapor pressure when comparing with other precursors such as halogen precursors. This indicates that a larger number of metal precursors having an amino functional group will be available for reaction than corresponding halogen precursors at similar deposition conditions. Therefore, when the liquid source including an amino functional group is used as the precursor, a large amount of metal source gas is introduced into the evaporating chamber to increase the number of molecules directly supplied onto the bottom portion of structures having aspect ratios greater than 1:10 or stepped portions. Accordingly, a thin film having an improved step coverage can be formed by using a metal precursor containing an amino functional group according to exemplary embodiments of the present invention rather than using the conventional halogen precursor. In addition, the thickness and uniformity of the thin metal oxide layer (for instance less than 30 Å) also can be controlled advantageously.

When implementing the step illustrated in FIG. 2C, any oxidant, including both activated oxidants that can produce oxygen radicals and oxidants containing a hydroxyl functional group can be used. In an exemplary embodiment, ozone gas is used in order to form a dielectric layer having improved breakdown resistance characteristics. When $H_2O$ is used as the oxidant, an —OH bond may be created within the metal oxide film resulting in an increased likelihood of forming fixed or trapped charges and increased dielectric leakage.

In addition, the ability to purge $H_2O$ vapor may be inferior to the ability to purge $O_3$, resulting in a need to increase purge and/or evaporation times. Further, when $H_2O$ vapor is used as the oxidant, charge trapping may be induced at layer interfaces resulting in a deterioration or degradation of the interface characteristics. When these problems occur, the likelihood of soft errors in the resulting memory devices tends to be increased, compromising the reliability of the devices. However, when $O_3$ is used as the oxidant, the above-described problems are generally minimized or reduced and stable dielectric and leakage current characteristics may be obtained. In addition, the $O_3$ oxidant has a low dependency on an underlying layer and is, therefore, used in exemplary embodiments of the present invention.

Figure 3:
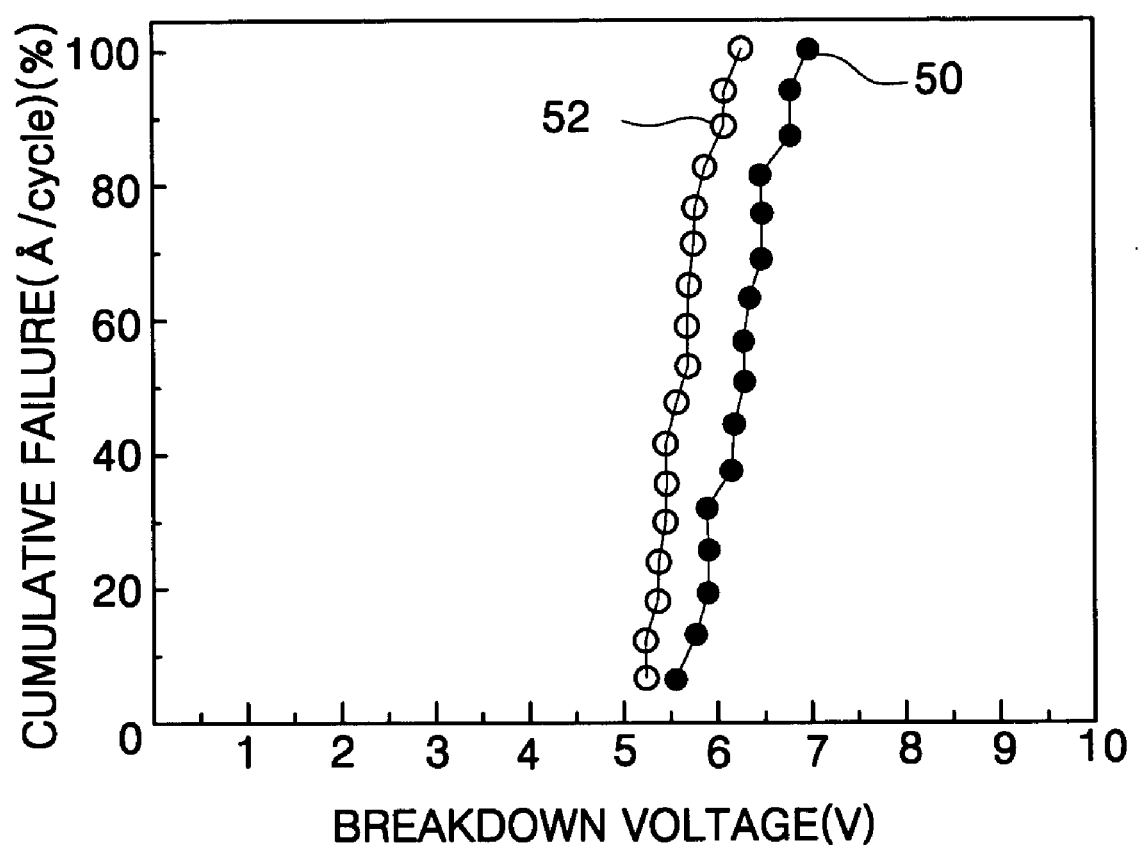
FIG. 3 illustrates cumulative failures obtained by measuring breakdown voltages at given positions of a substrate according to the kind of oxidants utilized during the formation of a $HfO_2$ layer according to exemplary embodiments of the present invention.

FIG. 3 is a graph illustrating cumulative failures obtained by measuring breakdown voltages at given positions on a substrate according to the kind of oxidants utilized during the formation of an $HfO_2$ layer according to exemplary embodiments of the present invention. In FIG. 3, the dielectric layer is a composite layer of $Al_2O_3$ (~30 Å) and $HfO_2$ (~10 Å). Trace 50 corresponds to the dielectric layer formed by using an $O_3$ oxidant and trace 52 corresponds to the dielectric layer formed using an $H_2O$ oxidant.

Referring to FIG. 3, it is noted that the $HfO_2$ layer formed using the $O_3$ oxidant has a higher breakdown voltage by about 0.5V than another exemplary $HfO_2$ layer formed using an $H_2O$ oxidant, and has a better stability as the dielectric layer.

Figure 4A:
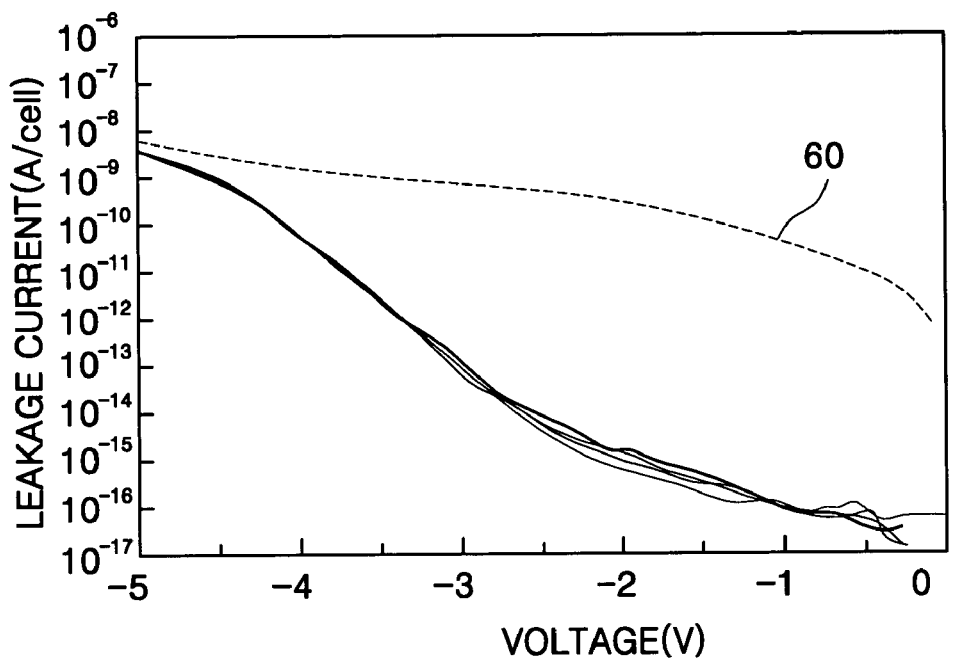
FIGS. 4A and 4B illustrate plots obtained by repeatedly measuring leakage currents with respect to voltages according to the kind of oxidants utilized during the formation of a $HfO_2$ layer according to exemplary embodiments of the present invention.
Figure 4B:
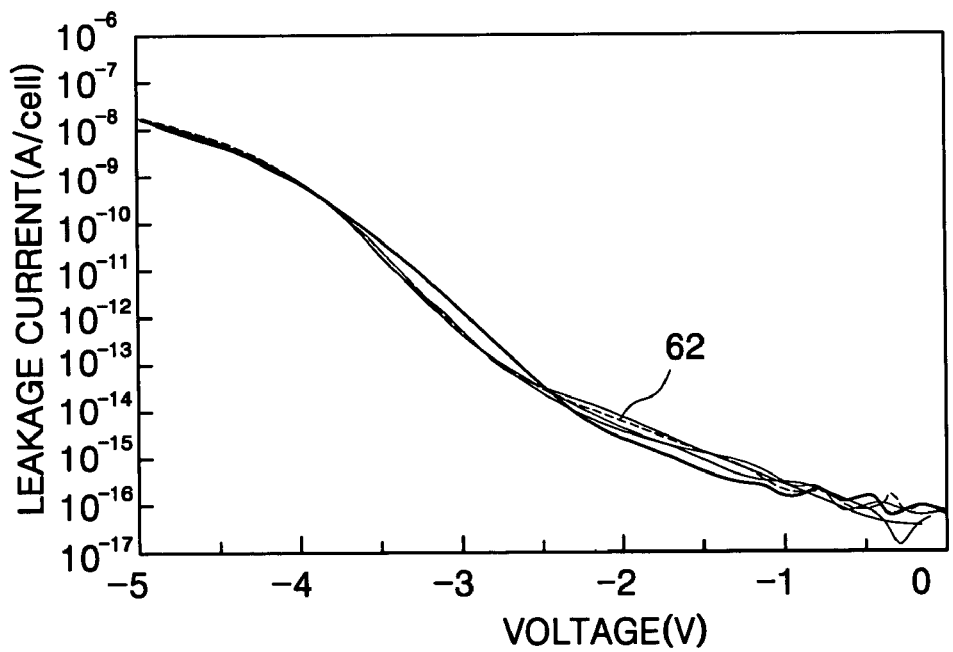

FIGS. 4A and 4B are graphs obtained by repeatedly measuring leakage currents with respect to voltages according to the kind of oxidants applied during forming a $HfO_2$ layer according to exemplary embodiments of the present invention. FIG. 4A corresponds to traces for a dielectric layer formed using a $H_2O$ oxidant and FIG. 4B corresponds to traces for a dielectric layer formed using an $O_3$ oxidant. In FIGS. 4A and 4B, the dielectric layer was a composite layer of $Al_2O_3$ (30 Å) and $HfO_2$ (10 Å).

Referring to FIG. 4A, the traces were obtained by measuring leakage current five times while repeatedly sweeping the voltage from 0 to −5V. During the fourth voltage sweep, a deteriorated leakage current was detected (illustrated as trace 60) indicating that a breakdown was generated during the fifth repeated measurement.

Referring to FIG. 4B, the traces were obtained by measuring leakage current seven times while repeatedly sweeping the voltage from 0 to −5V From this result, it may be confirmed that a stable leakage current is maintained as illustrated by trace 62 taken during the seven repeated sweepings that does not indicate any significant deterioration of the dielectric. Therefore, the dielectric layer formed using the $O_3$ oxidant illustrated a better performance under high voltage stress than a corresponding film formed using the $H_2O$ oxidant.

When the precursor containing the amino functional group is used to form a dielectric layer according to exemplary embodiments of the present invention, the deposition rate and a dielectric properties of the resulting dielectric are improved over the conventional methods. Hereinafter, these properties will be described in more detail.

When the precursor containing the amino functional group is used for the formation of the $HfO_2$ layer according to exemplary embodiments of the present invention, the deposition rate of the layer is increased when compared with methods using the conventional halogen precursors. When a layer is formed using an ALD method, factors determining the deposition rate include the reactivity of the precursor and the three-dimensional size of the precursor. When the reactivity of the precursor with the oxidant is not high, the reaction rate slows and lowers the deposition rate. Similarly, when the three-dimensional size of the precursor is large, reaction sites where the precursor must be absorbed may be shielded by other precursors previously absorbed on adjacent reaction site, lowering the reactant density, slowing the reaction rate and lowering the deposition rate.

In order to evaluate reactivity, the reaction mechanism of the precursors of TEMAH and tBH (i.e., $Hf(OtBu)_4$) with an $O_3$ oxidant will be compared. For the case of TEMAH, the Hf—N bond of $Hf(NC_2H_5CH_3)_4$ is broken by the $O_3$ oxidant and a Hf—O bond is produced during the reaction. For the case of the tBu precursor, the Hf—O bond or Hf—O—C bonds are broken by the $O_3$ oxidant during the reaction. At this time, the bonding states of the reacting elements H and C is Hf—O and C—O before/after the reaction. Therefore, the driving force of the reaction is not as large. Accordingly, TEMAH is a more reactive precursor than tBH.

The molecular structures of tBH and TEMAH will be compared. The three-dimensional size of TEMAH [$Hf(NC_3H_8)_4$] is smaller that that of tBH [$Hf(OC_4H_9)_4$]. Therefore, the surface coverage of the Hf element is higher when using the TEMAH liquid source than when using tBH source and will tend to increase the deposition rate.

Figure 5:
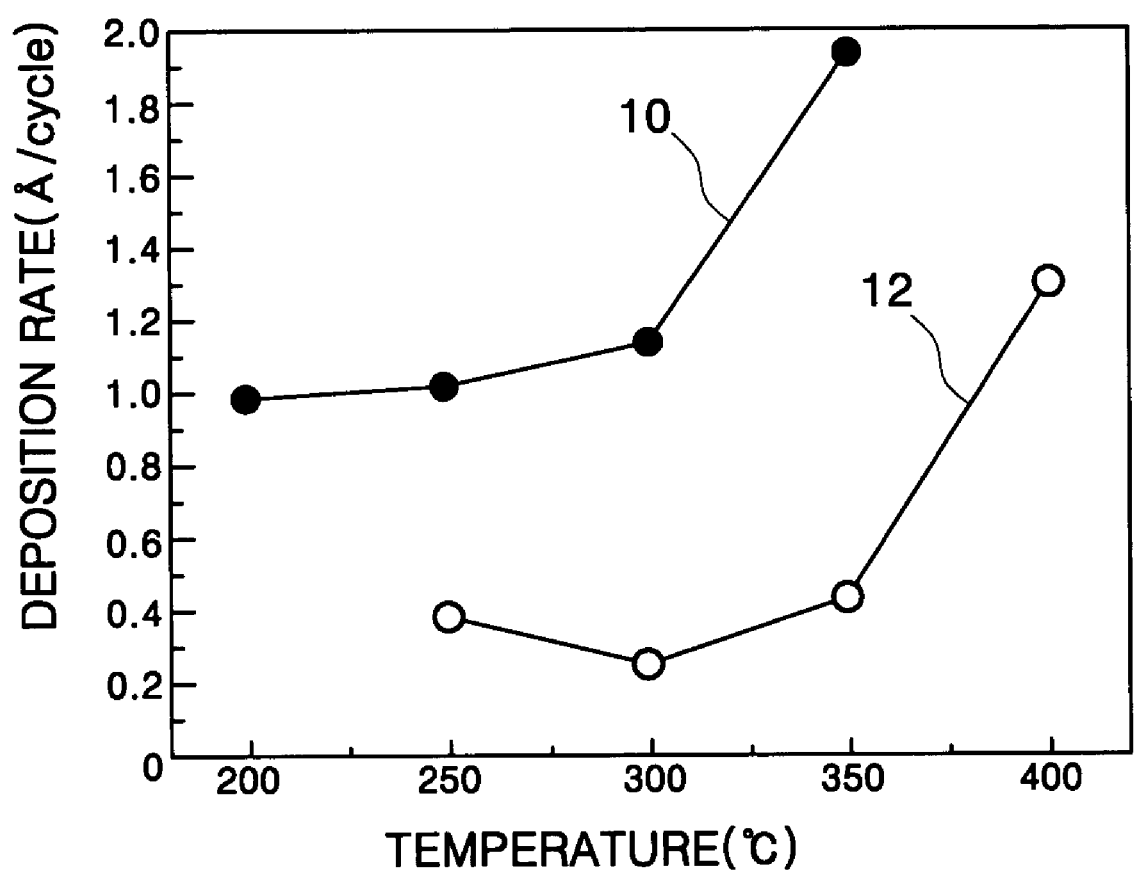
FIG. 5 illustrates deposition rates with respect to temperature for an ALD process according to exemplary embodiments of the present invention and according to a conventional method.

FIG. 5 illustrates graphs of deposition rates of $HfO_2$ layer with respect to temperatures during an ALD process according to exemplary embodiments of the present invention and according to a conventional method using a metal alkoxide compound as a precursor. In FIG. 5, trace 10 was obtained by forming the $HfO_2$ layer by an exemplary embodiment of the present invention and trace 12 was obtained through forming the $HfO_2$ layer by the conventional method.

In FIG. 5, the longitudinal axis represents the deposition temperature (° C.) and the vertical axis represents the thickness of the layer deposited per one cycle, that is, deposition rate (Å/cycle).

In particular, the precursor in these exemplary embodiments, TEMAH, was introduced for about 2 seconds and a purging gas Ar was introduced for about 4 seconds. The oxidant, $O_3$, was then introduced for about 4 seconds and a purging gas Ar was introduced for about 4 seconds. This procedure was repeated at various temperatures and the deposition rate was measured for each temperature. The same procedure was then repeated using the precursor tBH (tetra-butoxy hafnium ($Hf(OtBu)_4$).

As reflected in trace 10 in FIG. 5, an ALD behavior is illustrated at the temperature range of 200–300° C. and the deposition rate within this range is almost constant during formation of the $HfO_2$ layer. However, a more CVD-like behavior is observed at temperatures above 300° C. with the deposition rate increasing generally linearly with increasing temperature. At the reference temperature of 200° C., the deposition rate was about 1 Å/cycle.

When referring to trace 12 obtained while forming the $HfO_2$ layer by the conventional method, the ALD process behavior is observed across the temperature range of about 250–350° C. Further, the deposition rate at this temperature range is, at most, about 0.4 Å/cycle.

These results demonstrate that higher deposition rates for $HfO_2$ layers may be obtained by using metal precursors containing an amino functional group according to exemplary embodiments of the present invention when compared with metal precursors containing alkoxide functional groups. In addition, according to the present invention, the $HfO_2$ layer can be formed using an ALD process at a temperature of about 300° C. or less.

Even though an exemplary deposition temperature is 300° C. or less, an $HfO_2$ layer having a good electric characteristic can be formed at temperatures above 300° C. In particular, when $H_2O$ is used as an oxidant, a metal layer having a good electric characteristic can also be formed using an ALD process at about 350° C. Based on this experimental result, an exemplary temperature range for implementing the deposition may be about 100–500° C.

It has also been confirmed that a good step coverage (that is, a thickness ratio between the film formed on a structure at an upper portion and a bottom portion) of about 80% or over was obtained for a structure having an aspect ratio of about 13:1 or more when a layer is formed using an ALD method with TEMAH according to exemplary embodiments of the present invention.

Figure 6:
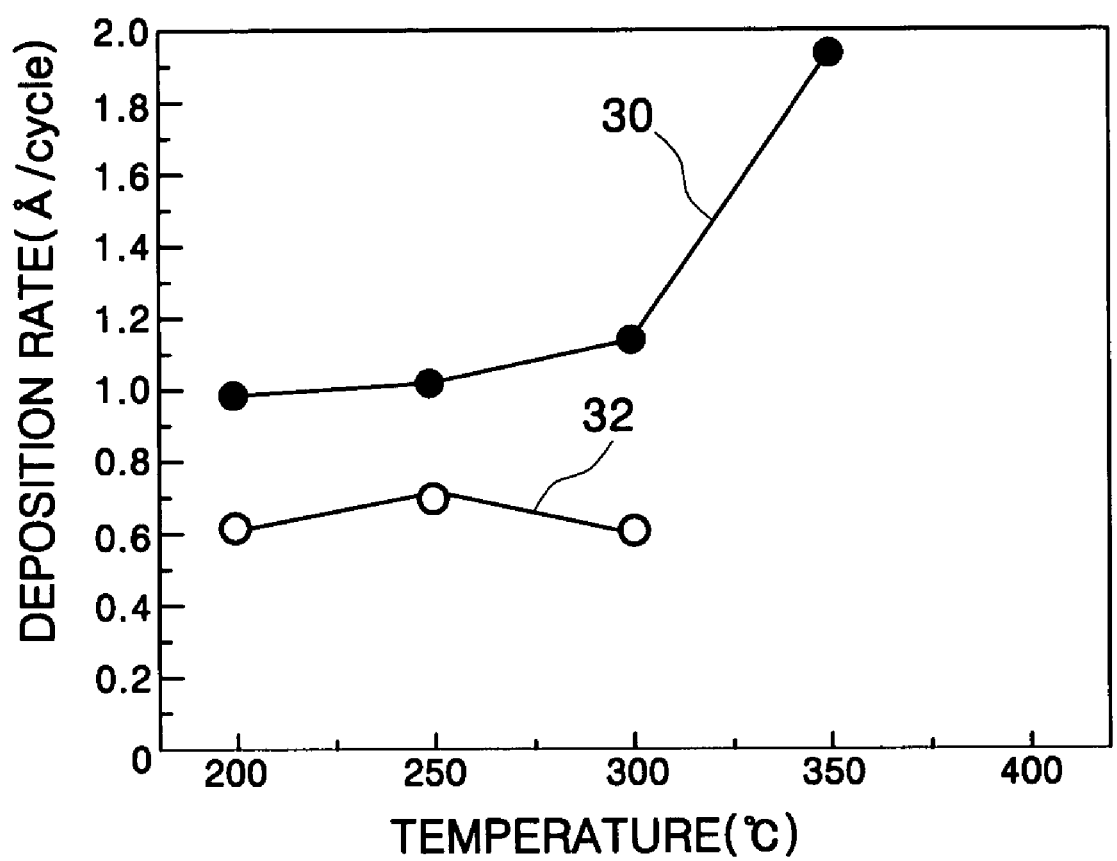
FIG. 6 illustrates deposition rates of a $HfO_2$ layer with respect to temperatures during implementation of ALD according to exemplary embodiments of the present invention on a planar plate and on a structure having a known aspect ratio.

FIG. 6 illustrates graphs of deposition rates of $HfO_2$ layer with respect to temperatures for implementing an ALD method according to exemplary embodiments of the present invention on a planar plate and on a structure having a known aspect ratio. Trace 30 was obtained when forming the $HfO_2$ layer on the planar plate and trace 32 was obtained when forming the $HfO_2$ layer on the structure having a known aspect ratio.

In FIG. 6, the longitudinal axis represents deposition temperature (° C.) and the vertical axis represents the thickness of the layer deposited layer per cycle, that is, a deposition rate (Å/cycle).

In particular, the metal precursor TEMAH was introduced for about 2 seconds and a purging gas Ar was introduced for about 4 seconds. An $O_3$ oxidant was introduced for about 4 seconds and a purging gas Ar was introduced for about 4 seconds. This procedure was repeated at various temperatures for the two structures and the deposition rate was measured after completing the above-described steps once (one cycle).

Referring to FIG. 6, the deposition rate was almost constant in spite of the temperature variance. That is, an ALD processing behavior is observed for the planar plate and the structure having a higher aspect ratio across the temperature range. This means that a layer having a good thickness uniformity may be formed according to exemplary embodiments of the method of the present invention.

The deposition rate obtained at the temperature range of about 200–300° C. will be compared. The deposition rate was about 1 Å/cycle when forming the layer on the planar plate as illustrated in graph 30. On the contrary, the deposition rate was about 0.7 Å/cycle when forming the layer on the structure having a higher aspect ratio as illustrated by trace 32. This suggests that a pattern loading ratio or effect due to the shape of the pattern of an underlying layer may be about 30%. The pattern loading ratio is reflected in reduced ratio of deposition dependent on the shape of the substrate to which the film is being applied.

The deposition rate of the $HfO_2$ layer according to the temperature variance and the pattern loading ratio were compared for deposition processes implemented on a planar plate and on a structure having a high aspect ratio (greater that 10:1) according to exemplary embodiments of the method of the present invention and the conventional method. The result is illustrated in Table 1 as follows.

TABLE 1

| Process condition | On planar silicon | High aspect ratio structure | Pattern loading ratio (%) |
|---|---|---|---|
| Hf(OtBu)4 + $O_3$ 300° C. | y = 0.25 x | y = 0.125 x | 50 |
| TEMAH(100° C.) + $O_3$ 250° C. | y = 1.01 x | y = 0.75 x | 26 |
| TEMAH(100° C.) + $O_3$ 200° C. | y = 0.98 x | y = 0.633 x | 35 |

Referring to Table 1, tBH (tetra-butoxy hafnium, $Hf(OtBu)_4$) was used as the precursor and $O_3$ was used as the oxidant in the conventional method. When using tBH as the metal precursor, ALD properties were obtained up to a temperature of about 350° C. and therefore, the processing temperature was set to 300° C.

In the equation illustrated in Table 1, x represents a cycle number and y represents a thickness of a deposited layer. Each coefficient of x represents the measured deposition rate for each process under the indicated conditions. The deposition rate of $HfO_2$ layer formed on a planar silicon plate according to exemplary embodiments of the present invention is about 4 times faster than that formed by the conventional method. Therefore, when forming the $HfO_2$ layer on the planar silicon plate, the processing time required for implementing exemplary embodiments of the present invention is reduced by about 75% when compared with the conventional method.

In addition, the deposition rate of the $HfO_2$ layer formed on the silicon structure having a high aspect ratio according to exemplary embodiments of the present invention was about six times faster than that formed by the conventional method. Therefore, when forming the $HfO_2$ layer on the silicon structure having the high aspect ratio, the processing time required for implementing exemplary embodiments of the present invention is only about one sixth that required for the conventional method.

When forming a thin film by using the precursor containing the amino functional group, the carbon content in the thin film is relatively small. Carbon contained in a dielectric layer increases a leakage current of a capacitor and adversely affects the stability of the dielectric layer. Accordingly, when the carbon content of the dielectric layer decreases, the electric properties of the resulting capacitor are improved. This characteristic will be described in more detail below.

Figure 7:
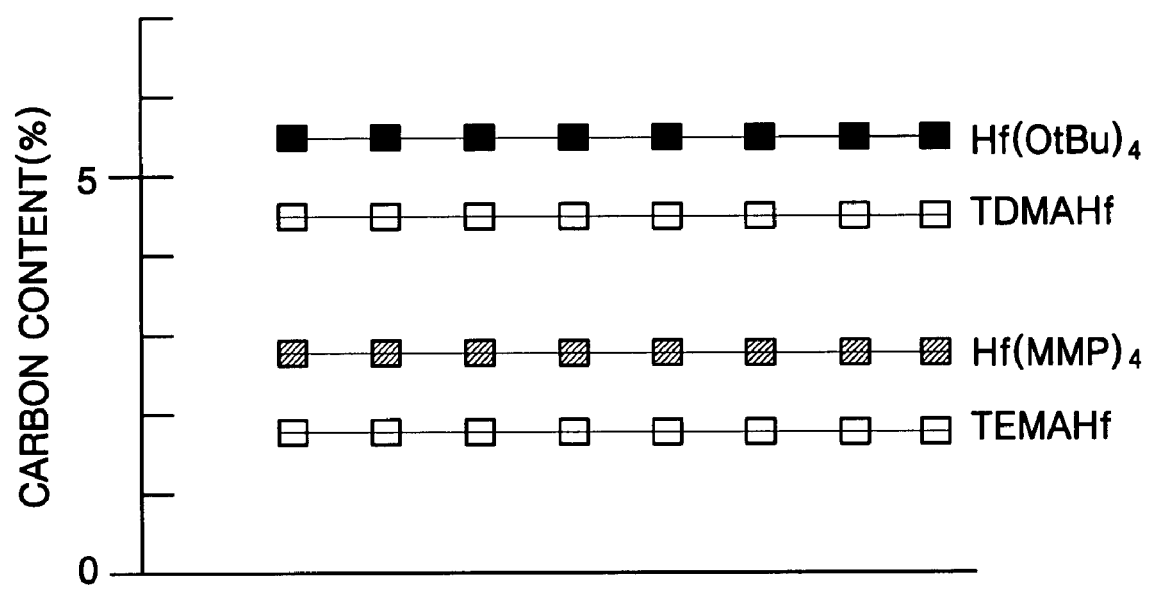
FIG. 7 illustrates carbon content of $HfO_2$ thin films formed using various precursor sources according to exemplary embodiments of the present invention when analyzed by a SIMS (second ion mass spectroscopy) analysis.

FIG. 7 illustrates the carbon content contained in a series of $HfO_2$ thin films formed through ALD processes using various precursor sources according to exemplary embodiments of the present invention and tested using a SIMS (second ion mass spectroscopy) analysis. In FIG. 7 the traces illustrate the carbon content of the various dielectric layers formed using different precursors.

Referring to FIG. 7, the carbon content in the dielectric layer is highest when the thin film is formed using a tBH [Hf(OtBu)$_4$] source. When inspecting the source having the molecular formula of Hf(OBu)$_4$, carbon is bonded to oxygen and the same O—C bonding is kept before/after carrying out a reaction with an oxidant. Accordingly, separation reaction of carbon from the bonding of Hf—O—C may be difficult and impede the removal of C—O bonds from an tBH source. On the contrary, the dielectric layer formed by deposition using the liquid source of TEMAH according to an exemplary embodiment of the present invention illustrates the lowest carbon content of the layers tested.

When the dielectric layer is formed by means of the deposition process of the precursor containing the amino functional group, nitrogen can be included in the dielectric layer without implementing any additional process. Recently, a thin film of HfO$_x$N$_y$ formed by adding nitrogen to a HfO$_2$ thin film is reported to have improved thin film properties.

For example, when HfO$_x$N$_y$ is used for the formation of a gate dielectric layer instead of HfO$_2$, the migration of boron ions and/or oxygen diffusion is suppressed and a thermal stability is good. Accordingly, the increase in the equivalent oxide thickness (EOT) for a layer due to a thermal budget is even smaller for gate dielectric layers formed using HfO$_x$N$_y$ when compared with gate dielectric layers formed using HfO$_2$.

In addition, it is reported that the thickness of an equivalent oxide layer ($E_{tox}$) of HfO$_x$N$_y$ is lower and a leakage current is better than HfO$_2$. Generally, the HfO$_x$N$_y$ layer is formed by depositing a HfN layer and then heat treating the layer in an oxidizing atmosphere to form an oxynitride layer.

However, when a precursor containing an amino functional group such as TEMAH is used to form the HfO$_2$ layer, nitrogen can be included in the resulting thin film without implementing a subsequent heat treatment. For example, it has been reported that an HfO$_2$ thin film formed using a LPCVD method using TDEAH [Hf(N(C$_2$H$_5$)$_2$)$_4$] and O$_2$, contains about 7% nitrogen.

According to repeated experiments conducted by the present inventors, it has been confirmed that an HfO$_2$ thin film formed using an ALD method using TEMAH and an O$_3$ oxidant also includes about 2% nitrogen. Therefore, a dielectric layer having good properties and including nitrogen therein can be advantageously formed according to exemplary embodiments of the method of the present invention.

Hereinafter, a method of manufacturing a semiconductor device will be described in order to explain a method of forming a capacitor according to an exemplary embodiment of the present invention.

FIGS. 8A–8E are cross-sectional views for explaining a method of forming a capacitor in a semiconductor process according to an exemplary embodiment of the present invention.

Figure 8A:
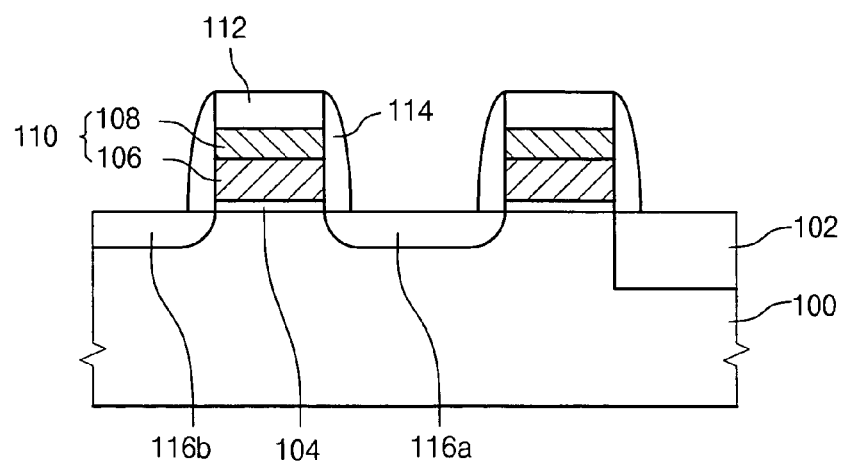
FIGS. 8A–8E are cross-sectional views for explaining a method of forming a capacitor in a semiconductor process according to an exemplary embodiment of the present invention.

Referring to FIG. 8A, an active region and a field region 102 are separately formed on a semiconductor substrate 100 by performing an isolation process. Thereafter, a transistor including a gate insulation layer 104, a gate electrode 110 and a source/drain region 116a and 116b, is formed on the substrate 100. A thin gate insulation layer 104 having a thickness of about 20 Å or less is required for the manufacture of a semiconductor device having a memory having a capacity of about 1 gigabit or more. However, the decrease in the gate insulation layer 104 may cause problems such as increased gate leakage current, penetration of dopant impurities in the gate, decreased threshold voltage, and the like. Therefore, the gate insulation layer 104 is preferably formed using a material having a high insulating property and a high dielectric constant by means of an ALD process according to exemplary embodiments of the present invention.

That is, the gate insulation layer 104 including HfO$_2$ is formed by using a liquid source containing hafnium and an amino functional group and an oxidant using an ALD process as illustrated in FIGS. 2A–2E. The liquid source containing hafnium and the amino functional group may include precursors such as TEMAH, TDEAH and TDMAH.

The oxidant may be an activated oxidant such as ozone (O$_3$) produced by a plasma generator, plasma O$_2$, remote plasma O$_2$, and plasma N$_2$O or a compound containing a hydroxyl functional group such as H$_2$O or H$_2$O$_2$. The gate electrode 110 may be formed with a polycide structure including an impurity doped polysilicon layer 106 and a metal silicide layer 108. The gate electrode 110 may also be formed with a structure that includes an impurity doped polysilicon layer 106 and a metal layer including a metal such as tungsten (W). At the upper portion and side portion of the gate electrode 110, a capping insulation layer 112 including silicon oxide and a side wall spacer 114 including silicon nitride are formed, respectively.

Figure 8B:
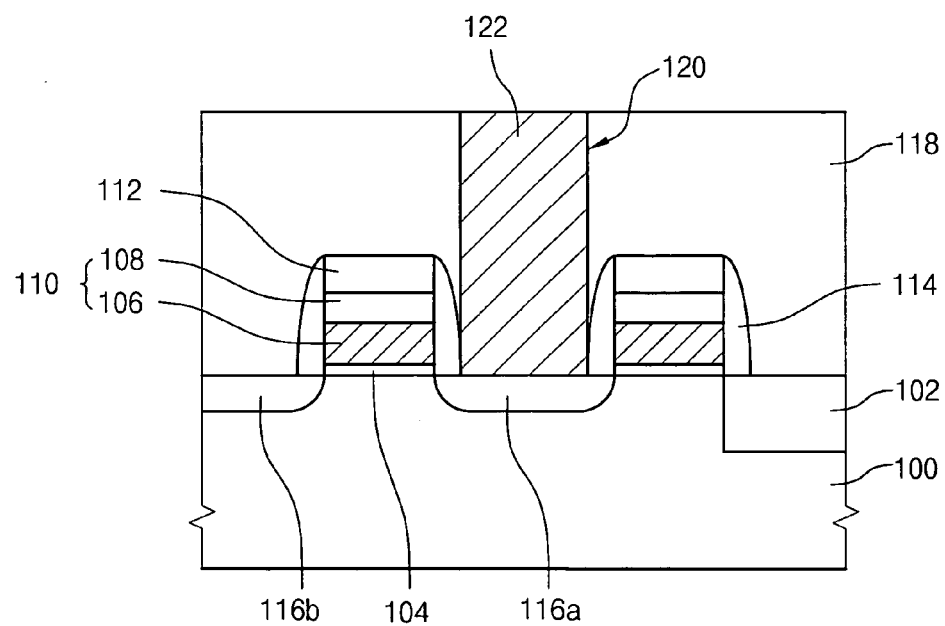

Referring to FIG. 8B, a first insulation layer 118, typically an oxide, is formed on the whole surface of the substrate 100 on which the transistor is formed. A contact hole 120 for exposing a portion of the source region 116a is formed by etching the first insulation layer 118 using a photolithography process. After that, a contact plug 122 is formed in the contact hole 120 by depositing a phosphorous (P) doped polysilicon layer to form a first conductive layer that fills up the contact hole 120 and is formed on the first insulation layer 118. The upper portion of the first conductive layer is then removed with an etch back process or a chemical mechanical polishing (CMP) to leave the contact plug 122.

Figure 8C:
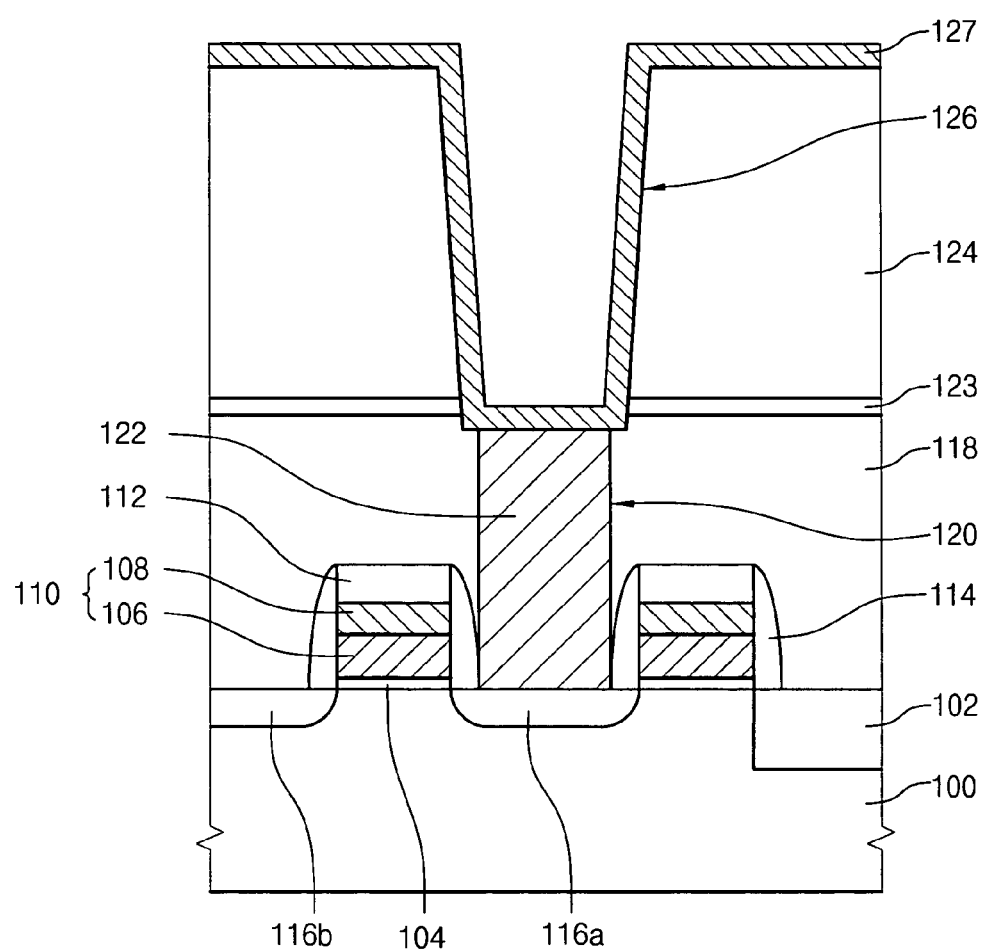

Referring to FIG. 8C, an etch stop layer 123 is formed on the contact plug 122 and the first insulation layer 118. The etch stop layer 123 is selected to provide a high etching selectivity with respect to the first insulation layer 118 such as a silicon nitride (Si$_x$N$_y$) layer or a silicon oxynitride (SiON) layer.

A second insulation layer 124, typically an oxide, is formed on the etch stop layer 123 and then etched to form an opening 126 to expose the contact plug 122. In particular, the second insulation layer 124 is etched until the etch stop layer 123 is exposed. After that, the etch stop layer 123 is etched to form the opening 126 and expose the contact plug 122 and an adjacent portion of the first insulation layer 118. The opening 126 may be formed with a vertical inclination resulting in the bottom portion of the opening 126 being more narrow than the upper open portion thereof. This shape may be obtained in part due to a loading effect during the etch process in which the etch rate at the bottom portion is slower than that at the upper portion of the opening 126.

A second conductive layer 127 is formed on the side portion and bottom portion of the opening 126 and on the second insulation layer 124. The second conductive layer 127 may be formed from a semiconductor material such as doped polysilicon, a metal such as ruthenium (Ru), platinum (Pt) and iridium (Ir), a conductive metal nitride compound such as TiN, TaN and WN, or a composite structure of two or more of these materials.

Figure 8D:
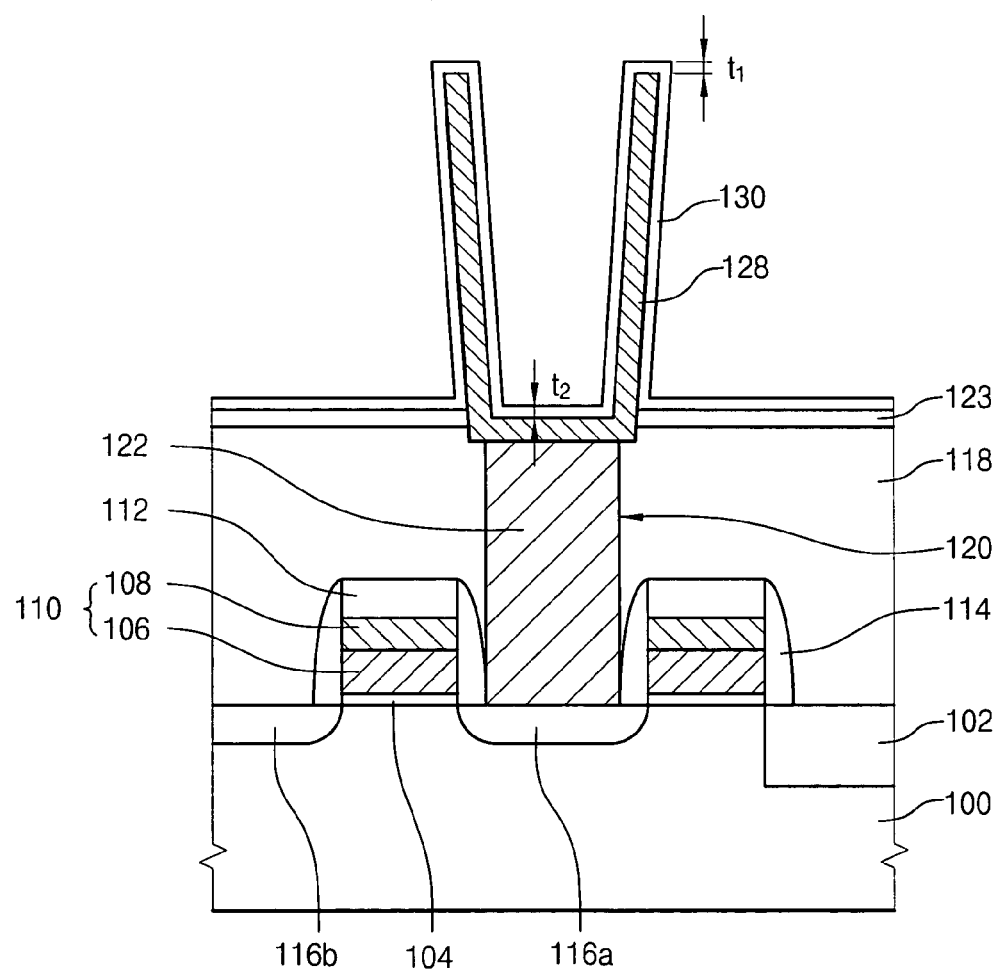

Referring to FIG. 8D, a sacrificial layer (not shown) is formed on the second conductive layer 127 and the opening 126. The upper portion of the sacrificial layer is then etched back so that the second conductive layer 127 may remain on the side portion and bottom portion of the opening 126. The second conductive layer 127 deposited on the surface portion of the second insulation layer 124 is removed. The second conductive layer 127 deposited along the profile of the inner portion of the opening portion 126 is then separated with the cell unit to form a lower electrode 128 of a capacitor at each cell region. After that, the sacrificial layer may be removed using a wet etch process. The lower electrode 128 may be formed to have a generally cylindrical shape in which the inlet portion is wide and bottom portion is narrow having a height of about 10,000–17,000 Å.

On the lower electrode 128, a dielectric layer 130 including $HfO_2$ is formed using a liquid source containing hafnium and an amino functional group and an oxidant, and an ALD method for example as illustrated in FIGS. 2A–2E. More particularly, the dielectric layer 130 of the capacitor may be formed by depositing $HfO_2$ by reacting TEMAH and $O_3$ using an ALD process. When forming the $HfO_2$ layer using TEMAH and $O_3$ with an ALD process, a dielectric layer 130 having a good step coverage can be achieved on the lower electrode 128 having an aspect ratio of about 13:1 or more. The ratio of the upper thickness ($t_1$) and the lower thickness ($t_2$) of thus formed dielectric layer 130 is about 1:0.8.

The dielectric constant of $HfO_2$ may be as high as about 20–25. A capacitor including a dielectric layer formed using $HfO_2$ will have a relatively high storage capacity when comparing with a capacitor using a dielectric layer formed using a similar thickness of a material having a relatively low dielectric constant. In addition, since the capacitor including $HfO_2$ has a relatively high energy band gap, a stable leakage current characteristic may be more easily obtained.

The dielectric layer 130 may be formed as a single layer of $HfO_2$ or may be formed as a composite layer including two or more layers of metal oxides that are alternately deposited. For example, the dielectric layer 130 may be formed by alternately depositing the layers of $Al_2O_3$ and $HfO_2$ by changing the precursors introduced into the chamber during the ALD process.

In particular, an $Al_2O_3$ layer having a thickness of about 35 Å may be formed using a TMA precursor and an $O_3$ oxidant. After that, an $HfO_2$ layer having a thickness of about 35 Å may be formed on the $Al_2O_3$ layer using a TEMAH precursor instead of the TMA precursor and applying the same ALD process conditions to form a dielectric layer 130 having an alternately deposited structure of the $Al_2O_3/HfO_2$. A dielectric layer having an alternate structure of $Al_2O_3/HfO_2/Al_2O_3/HfO_2$ or $HfO_2/Al_2O_3$ also can be instead of the $Al_2O_3HfO_2$ layer by modifying the deposition sequence.

When the lower electrode 128 is formed of polysilicon, silicon contained in the lower electrode 128 and oxygen will tend to react during heat treatments and oxidize the lower electrode 128. Therefore, before forming the dielectric layer 130, the surface portion of the lower electrode 128 may be nitrified by a rapid thermal process (RTP) under an atmosphere containing nitrogen to reduce or prevent a reaction between the dielectric layer 130 and the lower electrode. A SiN or SiON layer formed by the nitrification reaction at the surface portion of the lower electrode 128 functions as a portion of the dielectric layer of the capacitor along with the $HfO_2$ layer. Accordingly, the dielectric layer may be formed including an alternate structure of nitride layer/$Al_2O_3$/$HfO_2$ or nitride layer/$HfO_2$.

Figure 8E:
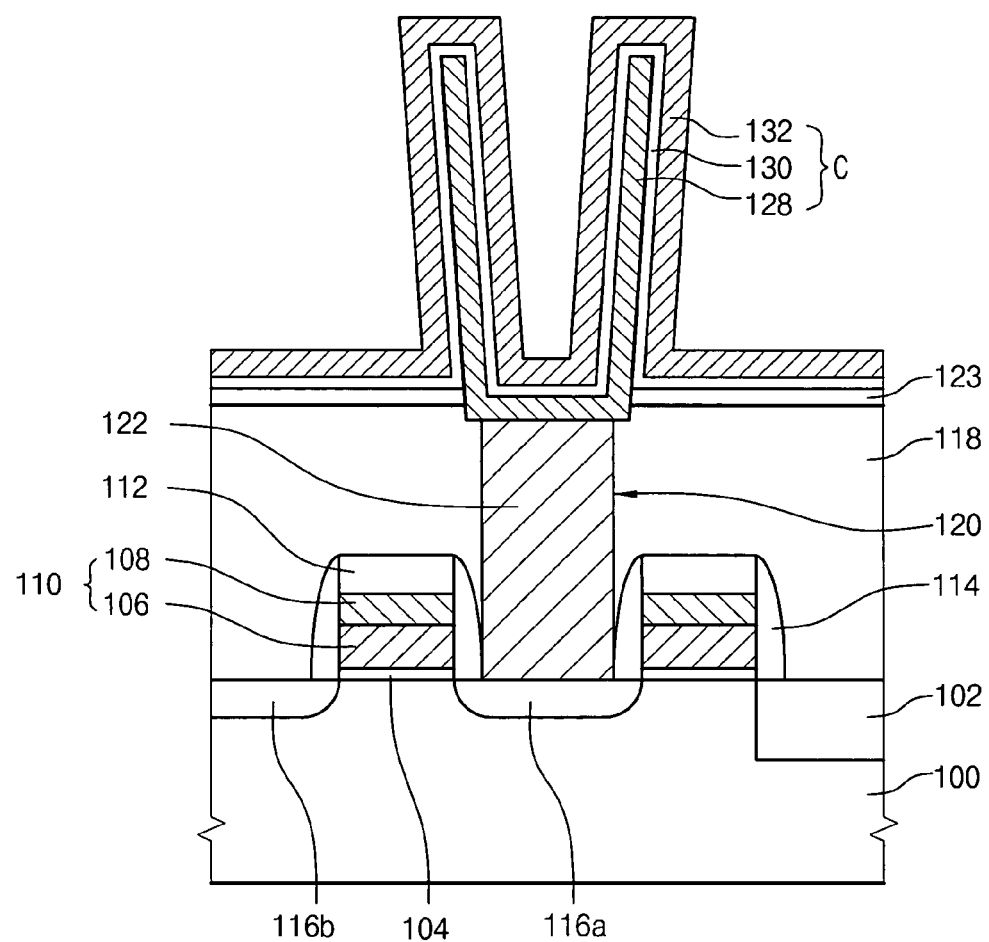

Referring to FIG. 8E, after being formed, the dielectric layer may be heat treated to remove contaminants formed on or incorporated in the dielectric layer and to cure oxygen defects. The heat treatment may be implemented under an atmosphere of untraviolet-$O_3$ (UV-$O_3$), plasma $O_2$, remote plasma $O_2$, nitrogen gas or vacuum.

An upper electrode 132 is formed on the dielectric layer 130 to form a capacitor C including the lower electrode 128, the dielectric layer 130 and the upper electrode 132. The upper electrode 132 may be formed using a semiconductor material including polysilicon, a metal such as ruthenium (Ru), platinum (Pt) or iridium (Ir), a conductive metal nitride such as TiN, TaN or WN, or a composite of two or more such materials. In an exemplary embodiment, the upper electrode 132 has a stacked structure with layers of both TiN and polysilicon.

Figure 9:
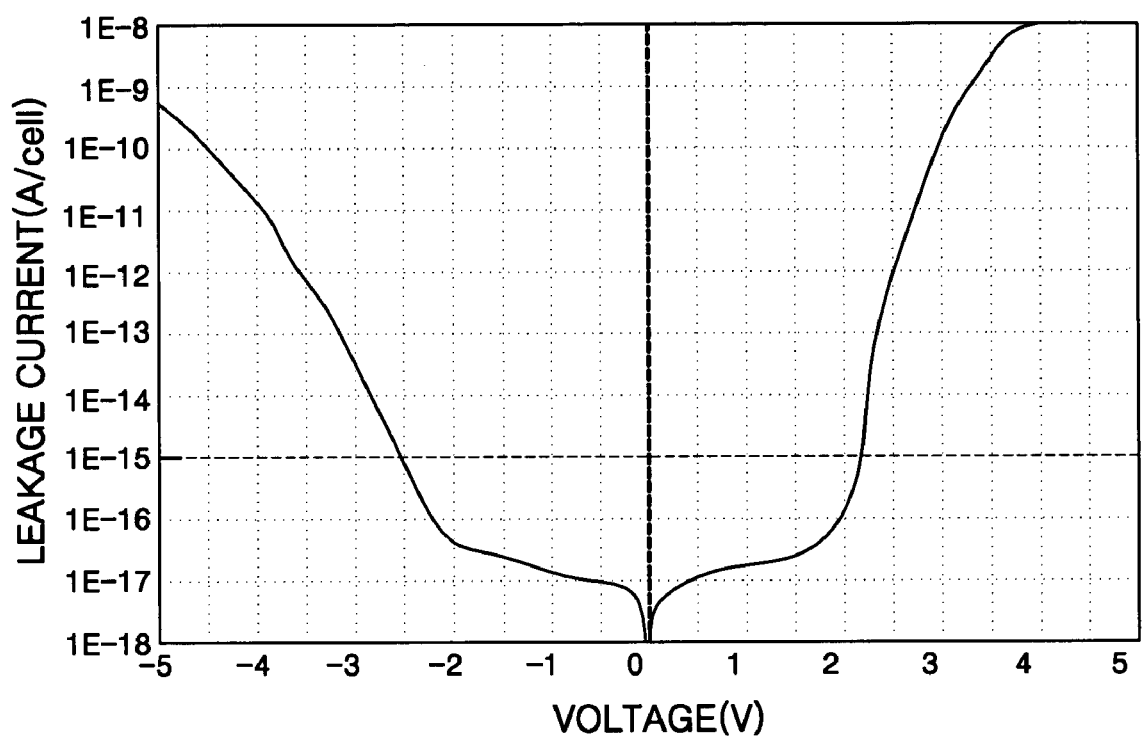
FIG. 9 illustrates leakage current with respect to voltage of a capacitor having a dielectric layer formed by an ALD method according to an exemplary embodiment of the present invention.

FIG. 9 is a graph illustrating a leakage current with respect to a voltage of a capacitor having a dielectric layer formed by an ALD method according to an exemplary embodiment of the present invention. In this graph, the longitudinal axis represents a voltage (V) and the vertical axis represents a leakage current (A/cell).

The capacitor may be formed, for example, by the above-described method as illustrated in FIGS. 8A–8E. More particularly, a nitrification process may be carried out by means of an RTP process using $N_2$ or $NH_3$ gas on the surface portion of the lower electrode of phosphorus (P) doped polysilicon. On the lower electrode, an $Al_2O_3$ layer having a thickness of about 35 Å was formed and an $HfO_2$ layer having a thickness of about 10 Å was formed on the $Al_2O_3$ layer to form a composite dielectric layer. The $HfO_2$ layer was formed using TEMAH and $O_3$ at a temperature range of about 100–300° C. using an ALD process. After forming the $HfO_2$ layer, a heat treatment at 750° C. under vacuum was implemented for about 2 seconds. An equivalent oxide thickness (EOT) of thus formed dielectric layer was about 20–30 Å.

The EOT represents a thickness of silicon oxide layer having the same capacitance with that of a capacitor including a dielectric layer formed by depositing materials other than silicon dioxide. Therefore, when two capacitors having different dielectric layers have the same capacitance, a dielectric layer having a lower EOT has a higher dielectric constant. The capacitance is inversely proportional to the thickness of the oxide layer and is proportional to the dielectric constant.

Therefore, a dielectric layer having a low EOT has a high dielectric constant. In FIG. 9, the dielectric layer had an EOT of about 29.7 Å. After completing the above-described processes, a TiN layer was formed through a deposition process using $TiCl_4$ and $NH_3$ gas on the $HfO_2$ layer. A phosphorous-doped polysilicon layer was then formed as the upper electrode having a TiN/polysilicon structure.

As can be noted from FIG. 9, the capacitor manufactured by the exemplary embodiment of the method of the present invention illustrate a leakage current of about 1 fA/cell or lower at a voltage of 1V The capacitor formed by the exemplary embodiment of the method of the present invention illustrate a stable leakage current characteristic even though being formed on a structure having an aspect ratio of about 13:1 or more.

Figure 10:
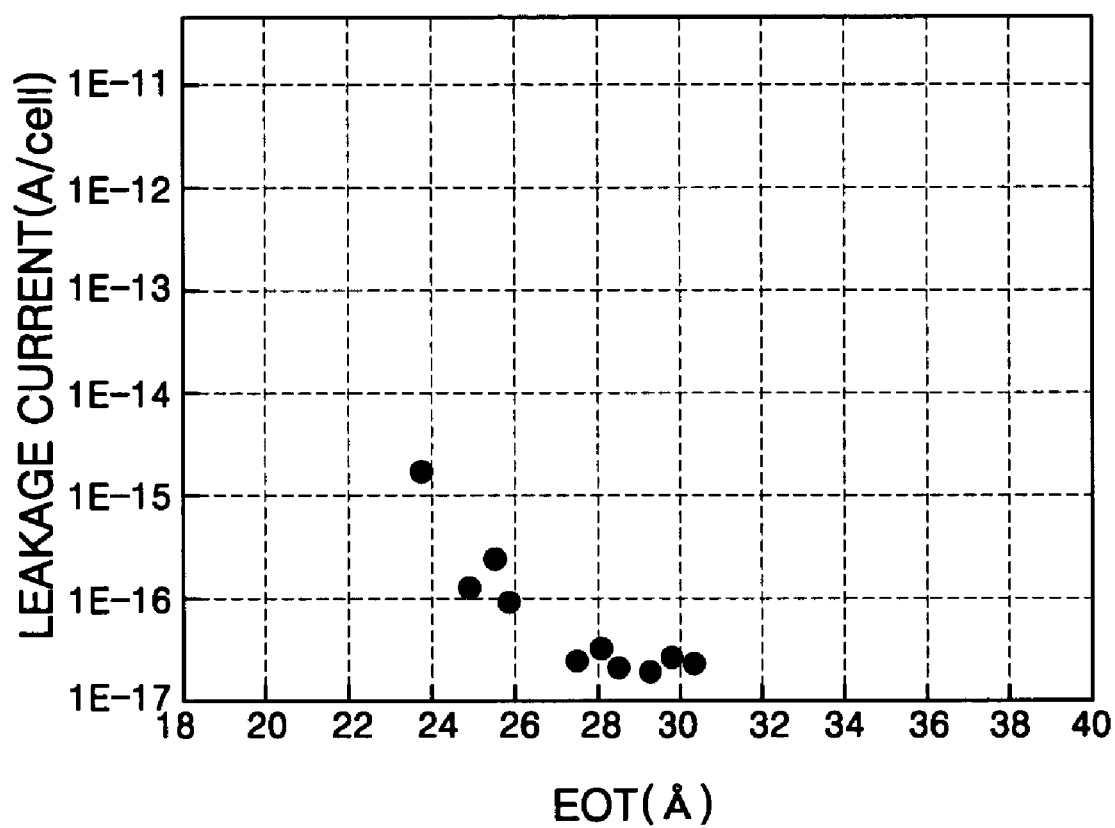
FIG. 10 illustrates leakage current with respect to the EOT (equivalent oxide thickness) of a capacitor having a dielectric layer formed using an ALD method according to an exemplary embodiment of the present invention.

FIG. 10 is a graph illustrating a leakage current with respect to an EOT of a capacitor having a dielectric layer formed by an ALD method according to exemplary embodiments of the present invention. In FIG. 10, the longitudinal axis represents an equivalent oxide thickness (Å) of the dielectric layer and the vertical axis represents a leakage current (A/cell). The dielectric layer of the capacitor is formed as a complex layer of $Al_2O_3/HfO_2$ and the leakage current was measured with a voltage of 1.2V applied to the capacitor.

Referring to FIG. 10, the measured leakage current was 1 fA/cell or less when the EOT of the dielectric layer of the capacitor was about 24–30 Å. Accordingly, the capacitors formed using the above-described exemplary processes illustrate a stable leakage current.

As described above, a deposition rate is increased when using a precursor containing Hf and an amino functional group and an oxidant using an ALD method while obtaining a metal oxide layer having a good deposition characteristics. Also, a thin film having a good step coverage and a decreased pattern loading rate can be formed by using the exemplary methods of forming the metal oxide layer.

A dielectric layer having a high dielectric constant also can be formed by using the exemplary embodiment of the method of the present invention and therefore, a capacitor of the semiconductor device having a good electric property even having a complicated structure can be manufactured. A highly integrated semiconductor device including a gate electrode having good properties and a capacitor having an increased storage capacity is accomplished.

Although the preferred embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method of forming a composite oxide layer on a substrate surface comprising:
    exposing the substrate surface to a first precursor including an amino functional group to form a chemisorbed first precursor layer on the substrate surface; and
    oxidizing the chemisorbed first precursor layer with a first oxidant to form a first oxide layer on the substrate surface;
    exposing the first oxide layer to a second precursor containing an amino functional group to form a chemisorbed second precursor layer on the first oxide layer;
    oxidizing the second precursor layer with a second oxidant to form a second oxide layer on the first oxide layer; wherein
    the first and second precursors are different.

2. A method of forming a composite oxide layer according to claim 1, wherein
    at least one of the first and second precursor is represented by a chemical formula of $MX_n$, with M representing one element selected from the group consisting of elements found in groups 2, 3A including lanthanide, 4A, 5A, 3B, 4B and 5B of the periodic table,
    X representing $-NR_1R_2$ wherein $R_1$ and $R_2$ independently selected from a group consisting of hydrogen and alkyl groups having 1–4 carbon atoms,
    and n represents the integer 2, 3, 4 or 5.

3. A method of forming a composite oxide layer according to claim 2, wherein
    M is an element selected from the group consisting of Sr, Ba, Y, La, Ti, Zr, Hf, V, Nb, Ta, Al, Ge, Pb, As, Sn, Si and Bi.

4. A method of forming a composite oxide layer according to claim 3, wherein M is hafnium.

5. A method of forming a composite oxide layer according to claim 1, wherein
    at least one of the first and second precursor is at least one selected from the group consisting of TEMAH, TDEAH, TDMAH, $Hf[N(C_3H_7)_2]_4$, $Hf[N(C_4H_9)_2]_4$, $Ti[N(CH_3)C_2H_5]_4$, $Zr[N(CH_3)C_2H_5]_4$, $Sn[N(CH_3)C_2H_5]_4$, $Si[N(CH_3)C_2H_5]_4$, $Ta[N(CH_3)C_2H_5]_5$, $Al[N(CH_3)C_2H_5]_3$ and $(CH_3)_2AlNH_2$.

6. A method of forming a composite oxide layer according to claim 1, wherein
    at least one of the first and second oxidant is at least one selected from the group consisting of $H_2O_2$, $H_2O$, $O_3$, $N_2O$, $NO_2$, plasma $O_2$, remote plasma $O_2$ and plasma $N_2O$.

7. A method of forming a composite oxide layer according to claim 6, wherein at least one of the first and second oxidant is $O_3$.

8. A method of forming an oxide layer according to claim 1, wherein
    at least one of the first and second precursor is represented by a chemical formula of $MX_nY_m$,
    with M representing one element selected from the group consisting of elements found in groups 2, 3A including lanthanide, 4A, 5A, 3B, 4B and 5B of the periodic table that has an oxidation state S, X representing $-NR_1R_2$ wherein $R_1$ and $R_2$ are independently selected from a group consisting of hydrogen and alkyl groups having 1–4 carbon atoms,
    and n represents the integer 1, 2, 3, 4 or 5, and Y is selected from a group consisting of hydrogen, alkyl groups having 1–4 carbons and amino functional groups $-NR_3R_4$ wherein $R_2$ and $R_4$ are independently selected from a group consisting of hydrogen and alkyl groups having 1–4 carbons,
    and m represents the integer 0, 1, 2, 3 or 4, and wherein m and n satisfy the equation (m+n)=S.

9. A method of forming a thin oxide film on a semiconductor substrate, the method comprising
    (a) introducing a volume of a first precursor having an amino functional group into a chamber under conditions that will cause a portion of the first precursor to chemisorb on a semiconductor substrate and form a first precursor layer;
    (b) removing from the chamber substantially all of the volume of the first precursor that is not incorporated in the first precursor layer;
    (c) introducing a volume of a first oxidant into the chamber;
    (d) reacting a portion of the first oxidant with the first precursor layer to form a first thin film on the semiconductor substrate;
    (e) removing an unreacted volume of the first oxidant from the chamber;
    (f) introducing a volume of a second precursor having an amino functional group into the chamber under conditions that will cause a portion of the second precursor to chemisorb on the first thin film and form a second precursor layer;
    (g) removing from the chamber substantially all of the volume of the second precursor that is not incorporated in the second precursor layer;
    (h) introducing a volume of a second oxidant into the chamber;
    (i) reacting a portion of the second oxidant with the second precursor layer to form a second thin film; and
    (j) removing from the chamber an unreacted volume of the second oxidant from the chamber; wherein
    the first and second precursors are different.

10. A method of forming a thin oxide film according to claim 9, wherein
at least one of the first and second precursor includes at least one material selected from the group consisting of TEMAH, TDEAH, TDMAH, Hf[N($C_3H_7$)$_2$]$_4$ and Hf[N($C_4H_9$)$_2$]$_4$.

11. A method of forming a thin oxide film according to claim 9, wherein
at least one of the first and second oxidant includes at least one selected from the group consisting of $H_2O_2$, $H_2O$, $O_3$, $N_2O$, $NO_2$, plasma $O_2$, remote plasma $O_2$ and plasma $N_2O$.

12. A method of forming an oxide thin film according to claim 11, wherein
at least one of the first and second oxidant is $O_3$.

13. A method of forming a thin oxide film according to claim 9, wherein
at least one of the first and second precursor is introduced into the chamber at a temperature not greater than about 300° C. and under a pressure not greater than about 0.4 Torr,
the at least one precursor being introduced into the chamber through the use of an inert carrier gas.

14. A method of forming a thin oxide film according to claim 9, wherein
at least one of groups of steps (a) through (e) and steps (f) through (j) are repeated at least once.

15. A method of forming a thin oxide film according to claim 9, wherein
removing from the chamber substantially all of the volume of at least one of the first and second precursor and removing the unreacted volume of at least one of the first and second oxidant from the chamber includes introducing an inert gas into the chamber.

16. A method of forming a capacitor of a semiconductor device comprising:
(a) forming a first electrode on a semiconductor substrate;
(b) exposing the first electrode to a first precursor containing an amino functional group to form a chemisorbed first precursor layer on the first electrode;
(c) reacting the first precursor layer with an oxidant to form a first oxide dielectric layer on the first electrode;
(d) exposing the first oxide dielectric layer to a second precursor containing an amino functional group to form a chemisorbed second precursor layer on the first electrode;
(e) reacting the second precursor layer with an oxidant to form a second oxide dielectric layer on the first electrode, the first and second oxide dielectric layers cooperating to form a composite dielectric layer; and
(f) forming a second electrode on the composite dielectric layer; wherein
the first and second oxide dielectric layers are different.

17. A method of forming a capacitor according to claim 16, wherein
at least one of the first and second precursor is at least one compound selected from the group consisting of TEMAH, TDEAH, TDMAH, Hf[N($C_3H_7$)$_2$]$_4$, Hf[N($C_4H_9$)$_2$]$_4$, Ti[N($CH_3$)$C_2H_5$]$_4$, Zr[N($CH_3$)$C_2H_5$]$_4$, Sn[N($CH_3$)$C_2H_5$]$_4$, Si[N($CH_3$)$C_2H_5$]$_4$, Ta[N($CH_3$)$C_2H_5$]$_5$, Al[N($CH_3$) $C_2H_5$]$_3$ and ($CH_3$)$_2$AlNH$_2$.

18. A method of forming a capacitor according to claim 16, wherein
at least one of the first and second oxidant is at least one selected from the group consisting of $H_2O_2$, $H_2O$, $O_3$, $N_2O$, $NO_2$, plasma $O_2$, remote plasma $O_2$ and plasma $N_2O$.

19. A method of forming a capacitor according to claim 16, wherein
the first electrode has an aspect ratio of at least 10:1.

20. A method of forming a capacitor according to claim 16, wherein
the first electrode includes a layer of at least one conductive material selected from the group consisting of doped polysilicon, metal nitrides and metals.

21. A method of forming a capacitor according to claim 20, wherein
the first electrode includes a doped polysilicon layer and a nitride layer formed on a surface of the doped polysilicon layer.

22. A method of forming a capacitor according to claim 16, wherein
the second electrode includes a layer of at least one conductive material selected from the group consisting of doped polysilicon, metal nitrides and metals.

23. A method of forming a capacitor of a semiconductor device comprising:
(a) forming a first electrode on a semiconductor substrate;
(b) exposing the first electrode to a first precursor containing an amino functional group to form a chemisorbed first precursor layer on the first electrode;
(c) reacting the first precursor layer with an oxidant to form a first oxide dielectric layer on the first electrode;
(d) exposing the first oxide dielectric layer to a second precursor containing an amino functional group to form a chemisorbed second precursor layer on the first electrode;
(e) reacting the second precursor layer with an oxidant to form a second oxide dielectric layer on the first electrode, the first and second oxide dielectric layers cooperating to form a composite dielectric layer; and
(f) forming a second electrode on the composite dielectric layer, wherein
the first and second oxide dielectric layers are different and are selected from a group consisting of $HfO_2$, $ZrO_2$, $Ta_2O_5$, $Y_2O_3$, $Nb_2O_5$, $TiO_2$, $CeO_2$, $In_2O_3$, $RuO_2$, $MgO$, $SrO$, $B_2O_3$, $SiO_2$, $GeO_2$, $SnO_2$, $PbO$, $PbO_2$, $V_2O_3$, $La_2O_3$, $As_2O_5$, $As_2O_3$, $Pr_2O_3$, $Sb_2O_3$, $Sb_2O_5$, $CaO$ and $P_2O_5$.

24. A method of forming a capacitor according to claim 23, wherein
the first and second oxide dielectric layers are $Al_2O_3$ and $HfO_2$.

25. A method of forming a capacitor on a semiconductor device comprising:
forming a first electrode;
forming an oxide layer according to claim 1; and
forming a second electrode.

* * * * *